(12) United States Patent
Olson

(10) Patent No.: US 6,930,184 B2
(45) Date of Patent: Aug. 16, 2005

(54) FUNCTIONAL FLUORESCENT DYES

(75) Inventor: David B. Olson, Marine on Saint Croix, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 10/206,315

(22) Filed: Jul. 26, 2002

(65) Prior Publication Data
US 2004/0016370 A1 Jan. 29, 2004

(51) Int. Cl.⁷ .................... C07D 495/06; C07D 498/02
(52) U.S. Cl. .................. 546/47; 106/498; 528/375; 549/24
(58) Field of Search ........................................... 546/47

(56) References Cited

U.S. PATENT DOCUMENTS

| | | |
|---|---|---|
| 2,803,615 A | 8/1957 | Ahlbrecht et al. |
| 2,841,573 A | 7/1958 | Ahlbrecht et al. |
| 4,036,859 A | 7/1977 | Ribaldone et al. |
| 4,698,240 A | 10/1987 | Ono et al. |
| 4,795,794 A | 1/1989 | Winnik et al. |
| 5,151,516 A | 9/1992 | Beck et al. |
| 5,415,669 A | 5/1995 | Bühler et al. |
| 5,847,091 A | 12/1998 | Shiraki et al. |
| 5,847,156 A | 12/1998 | Eldin et al. |
| 6,001,936 A | 12/1999 | Barrera et al. |
| 6,391,807 B1 | 5/2002 | Jariwala et al. |
| 6,448,301 B1 | 9/2002 | Gaddam et al. |
| 2002/0042470 A1 | 4/2002 | Moore et al. |

FOREIGN PATENT DOCUMENTS

| | | |
|---|---|---|
| EP | 0 004 655 A2 | 10/1979 |
| EP | 0 323 060 A2 | 7/1989 |
| EP | 0 422 535 A1 | 4/1991 |
| EP | 0 554 696 A2 | 8/1993 |
| EP | 1 172 418 A2 | 1/2002 |
| GB | 1 270 254 | 4/1972 |
| WO | WO 90/01526 | 2/1990 |
| WO | WO 99/21937 | 5/1999 |
| WO | WO 01/23472 A1 | 4/2001 |
| WO | WO 02/16306 A2 | 2/2002 |
| WO | WO 02/16517 A2 | 2/2002 |
| WO | WO 02/20625 A1 | 3/2002 |
| WO | WO 02/066483 | * 8/2002 |

* cited by examiner

Primary Examiner—Evelyn Mei Huang
(74) Attorney, Agent, or Firm—Lisa P. Fulton

(57) ABSTRACT

Fluorescent functional dyes represented by the following formulas:

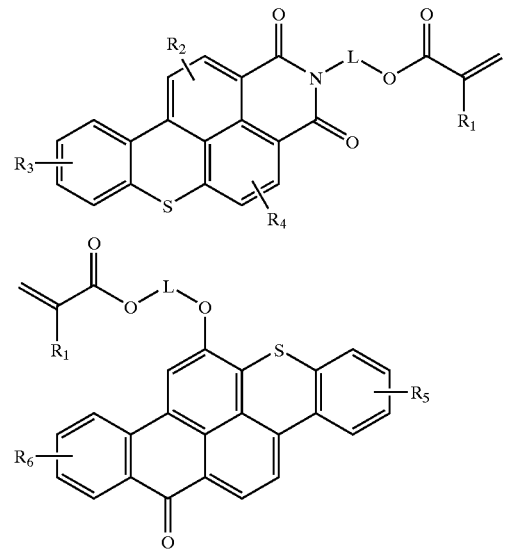

wherein $R_1$ is hydrogen or methyl; $R_2$, $R_3$, $R_4$, $R_5$, and $R_6$ are each independently selected from the group consisting of hydrogen, alkyl, aryl, alkoxy, aralkyl, alkaryl, halo, and trifluoromethyl; and L is a straight chain or branched chain alkylene containing 3 to about 15 carbon atoms, the alkylene group optionally containing one or more catenary heteroatoms.

1 Claim, No Drawings

FUNCTIONAL FLUORESCENT DYES

FIELD

This invention relates to fluorescent dyes and, in other aspects, to polymer coatings and films comprising the dyes.

BACKGROUND

Conformal coatings are protective coatings that conform to the surface of electronic components and circuit board assemblies. Properly applied conformal coatings can increase the working life of the assemblies by protecting its components and the board itself. Proper coverage and uniformity of the conformal coating over the assembly is critical for effective protection of the assembly. It can be difficult, however, to determine the integrity and uniformity of the conformal coating when it is coated on an assembly. Therefore, the conformal coating material is sometimes doped with a fluorescent dye or "tracer" to aid in the quality assurance inspection of the assembly for proper coverage.

Fluorescent dyes such as, for example, thioxanthene compounds, work well for imparting color to certain plastic materials such as, for example, polymethacrylate, polycarbonate, polystyrene, and polyester. Most fluorescent dyes, however, have poor or limited solubility in certain polymer matrixes. For instance, most fluorescent dyes have poor or no compatibility with fluorochemical monomers and polymers. This results in poor color quality and dye bleed and little or no color entrainment into the resulting fluoropolymer. Fluoropolymers containing dyes are therefore typically not used when leaching and toxicity issues are of concern (for example, in food packaging and medical applications). There is also little advantage in adding most dyes to fluoropolymer conformal coatings since the dyes typically do not entrain uniformly throughout the coating such that they are useful during quality control inspection.

SUMMARY

In view of the foregoing, we recognize that there is a need for fluorescent dyes that are compatible with various polymer matrixes, including fluoropolymers, and that impart stable color to resulting polymers and fluoropolymers.

Briefly, in one aspect, the present invention provides novel fluorescent acrylate functional dyes represented by the following formula (hereinafter referred to as "yellow-green fluorescent dyes"):

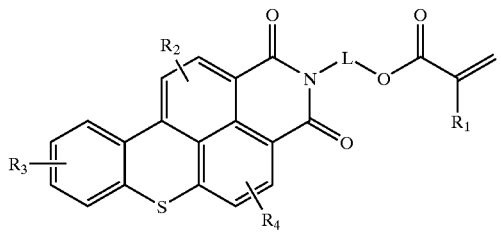

wherein $R_1$ is hydrogen or methyl; $R_2$, $R_3$, and $R_4$ are each independently selected from the group consisting of hydrogen, alkyl, aryl, alkoxy, aralkyl, alkaryl, halo, and trifluoromethyl; and L is a divalent alkylene (straight chain or branched chain) containing 3 to about 15 carbon atoms, the alkylene group optionally containing one or more catenary heteroatoms. As used herein, the term "catenary heteroatoms" means a heteroatom (for example, nitrogen, oxygen, or sulfur) that replaces one or more carbon atoms of the L linking group in a manner such that the heteroatom is bonded to at least two carbon atoms of the L linking group.

A preferred embodiment of the yellow-green fluorescent dyes of the invention can be represented by the following formula:

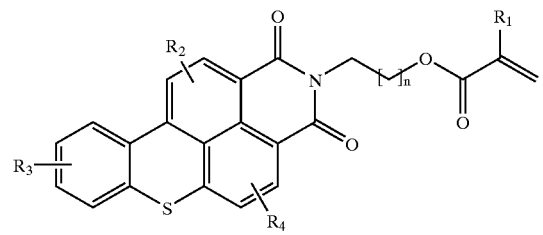

wherein n is an integer from 2 to about 15; $R_1$ is hydrogen or methyl; and $R_2$, $R_3$, and $R_4$ are each independently selected from the group consisting of hydrogen, alkyl, aryl, alkoxy, aralkyl, alkaryl, halo, and trifluoromethyl. Preferably, n is 4 or 5; more preferably, n is 4.

In another aspect, this invention provides novel fluorescent acrylate functional dyes represented by the following formula (hereinafter referred to as "red fluorescent dyes":

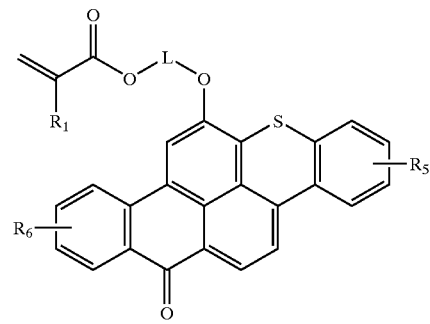

wherein $R_1$ is hydrogen or methyl; $R_5$ and $R_6$ are each independently selected from the group consisting of hydrogen, alkyl, aryl, alkoxy, aralkyl, alkaryl, halo, and trifluoromethyl; and L is a divalent alkylene (straight chain or branched chain) containing 1 to about 15 carbon atoms, the alkylene group optionally containing one or more catenary heteroatoms.

A preferred embodiment of red fluorescent dyes of the invention can be represented by the following formula:

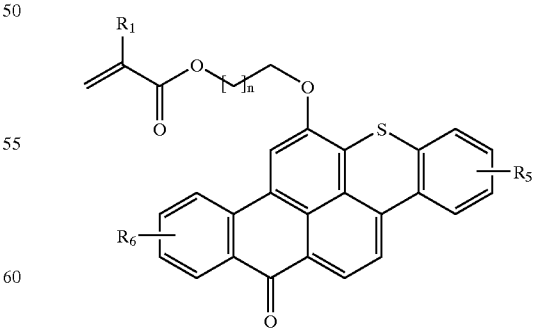

wherein n is an integer from 1 to about 15; R1 is hydrogen or methyl; and R5 and R6 are independently selected from the group consisting of hydrogen, alkyl, aryl, alkoxy, aralkyl, alkaryl, halo, and trifluoromethyl. Preferably, n is 7.

It has been discovered that the above-described yellow-green and red fluorescent dyes can be covalently bonded to oligomers and polymers and are therefore surprisingly compatible with various polymer systems, including fluoropolymer systems. The yellow-green and red fluorescent dyes of the invention can, for example, be co-polymerized with fluorochemical acrylate monomers to give fluorescent dyed fluoropolymers that are highly resistant to leaching and blooming. Such fluorescent dyed fluoropolymers are useful, for example, as conformal coatings and in many medical and food packaging applications where leaching and toxicity issues are of concern.

Thus, the compounds of the invention meet the need in the art for fluorescent dyes that have increased solubility in and are compatible with various polymers and fluoropolymers. The dyes of the invention are useful for imparting color and fluorescence to various articles (for example, food packaging and medical articles such as respiratory masks) and in particular to fluoropolymer conformal coatings used to protect electronic components.

DETAILED DESCRIPTION OF ILLUSTRATIVE EMBODIMENTS

As referred to herein, the term "dye" shall mean substances which impart color to a substrate by selective absorption of wavelengths of light.

As referred to herein the term "chromogen" shall refer to the aromatic portion of the dye.

As referred to herein, the term "chromophore" shall refer to the specific groupings of substituents on the chromogen which give rise to various colors selectively shifting the absorption of the wavelength of light.

The term "alkyl" refers to straight or branched hydrocarbon radicals, such as, for example, methyl, ethyl, propyl, butyl, octyl, isopropyl, tert-butyl, sec-pentyl, and the like. Alkyl groups can either be unsubstituted or substituted with one or more substituents (for example, halogen, alkoxy, aryl, arylalkyl, aralkoxy, and the like).

The term "alkenyl" refers to straight or branched unsaturated hydrocarbon radicals having one or more double bonds such as, for example, ethylene, propylene, butylene, 1,3-pentadiene, 1,4-pentadiene, and the like. Alkenyl groups can either be unsubstituted or substituted with one or more substituents (for example, haloalkyl, halogen, alkoxy, aryl, arylalkyl, aralkoxy and the like).

The term "alkylene" refers to a divalent straight or branched saturated hydrocarbon radical such as, for example, —CH$_2$—, —CH$_2$CH$_2$—, —CH$_2$CH$_2$CH$_2$—, —CH$_2$CH$_2$CH(CH$_3$)CH2—, —CH$_2$CH(CH$_2$CH$_3$)CH$_2$CH(CH$_3$)CH2—, and the like.

The term "halo" refers to fluoride, chloride, bromide, and iodide radicals.

The term "haloalkyl" refers to an alkyl group substituted with a halo radical.

The term "hydroxyalkyl" refers to an alkyl group substituted with a hydroxyl moiety.

The term "aryl" refers to monovalent unsaturated aromatic carboxylic radicals having a single ring (for example, phenyl) or multiple condensed rings (for example, naphthyl or anthryl), which can be optionally substituted by substituents such as halogen, alkyl, arylalkyl, alkoxy, aralkoxy, and the like.

The term "alkoxy" refers to —O-alkyl. Alkoxy groups include, for example, methoxy, ethoxy, propoxy, isopropoxy, and the like.

The term "aralkyl" refers to an aryl radical substituted with an alkyl radical (for example, aryl-alkyl-). Aralkyl groups include, for example, phenethyl, benzyl, and naphthethyl.

The term "alkaryl" refers to an alkyl radical bonded to an aryl radical, thus producing a divalent moiety (for example, alkyl-aryl-).

The term "aralkylene" refers to an aryl radical substituted with an alkylene radical, thus producing a divalent moiety (for example, -aryl-alkyl-). Aralkylene groups include, for example, phenethyl, benzyl, and naphthethyl.

Preparation of Yellow-Green Acrylate Functional Fluorescent Dyes

A method for preparing the yellow-green acrylate functional fluorescent dyes is, for example, as follows:

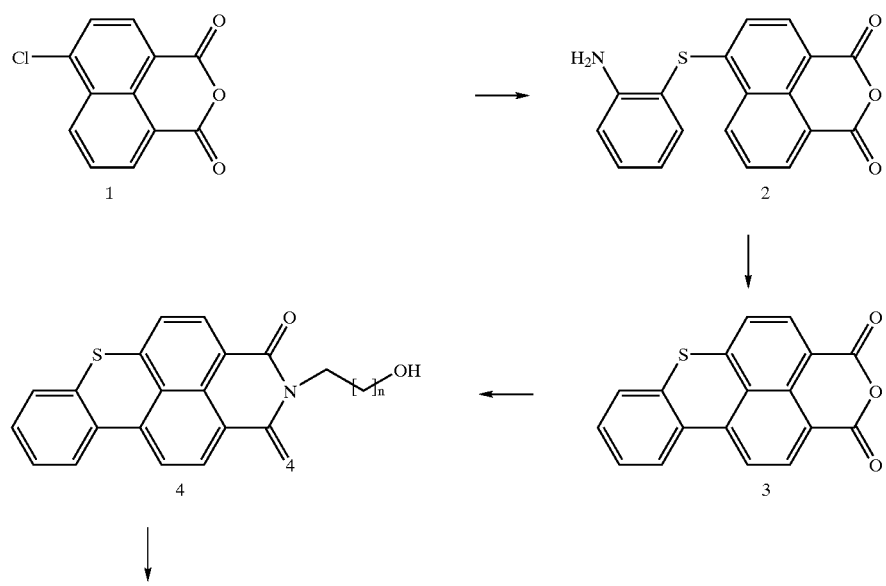

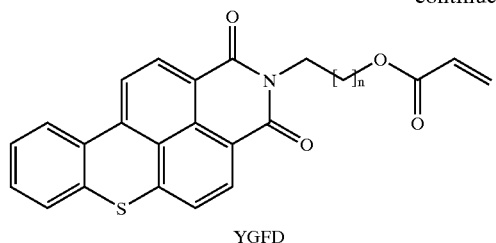

YGFD

Typically, 4-chloronaphthalic anhydride (1) is used as a starting material. This material can be reacted with 2-aminothiophenol to yield a thioether (2). Further reaction of the thioether (2) in an acidified polar aprotic solvent with sodium nitrite results in the corresponding thioxanthene derivative (3). The thioxanthene derivative (3) can then be further reacted with an alkanol amine to form the imide derivative of the thioxanthene (4). The imide derivative (4) can then be (meth)acrylate functionalized using methods known in the art such as, for example, by esterification using reagents such as (meth)acrylic acid or (meth)acryloyl chloride to form the resulting yellow-green fluorescent dye (YGFD).

Alternatively, vinyl ethers can be prepared by reacting vinyl acetate with (4) in the presence of a mercury catalyst, or allyl ethers can be prepared by reacting allyl bromide with (4) in the presence of a base.

Preparation of Red Acrylate Functional Fluorescent Dyes

A method for preparing the red acrylate functional fluorescent dyes is, for example, as follows:

then be brominated at the 3-position using a brominating agent such as n-bromosuccinimide in polar aprotic solvents. The resulting brominated species (7) can be reacted with a 2-aminothiophenol to produce a thioether (8). The thioether (8) can then be reacted with hydrochloric acid and sodium nitrite to yield the corresponding thioxanthene derivative (9). The thioxanthene derivative can be (meth)acylate functionalized using methods known in the art such as, for example, by esterification using reagents such as (meth) acrylic acid or (meth)acryloyl chloride to form the resulting red fluorescent dye (RFD).

Alternatively, vinyl ethers can be prepared by reacting vinyl acetate with (4) in the presence of a mercury catalyst, or allyl ethers can be prepared by reacting allyl bromide with (4) in the presence of a base.

Dyed Polymers

The yellow-green and red fluorescent dyes of the invention can be co-polymerized with one or more monomers to give fluorescent oligomers or copolymers that have uniform and stable color.

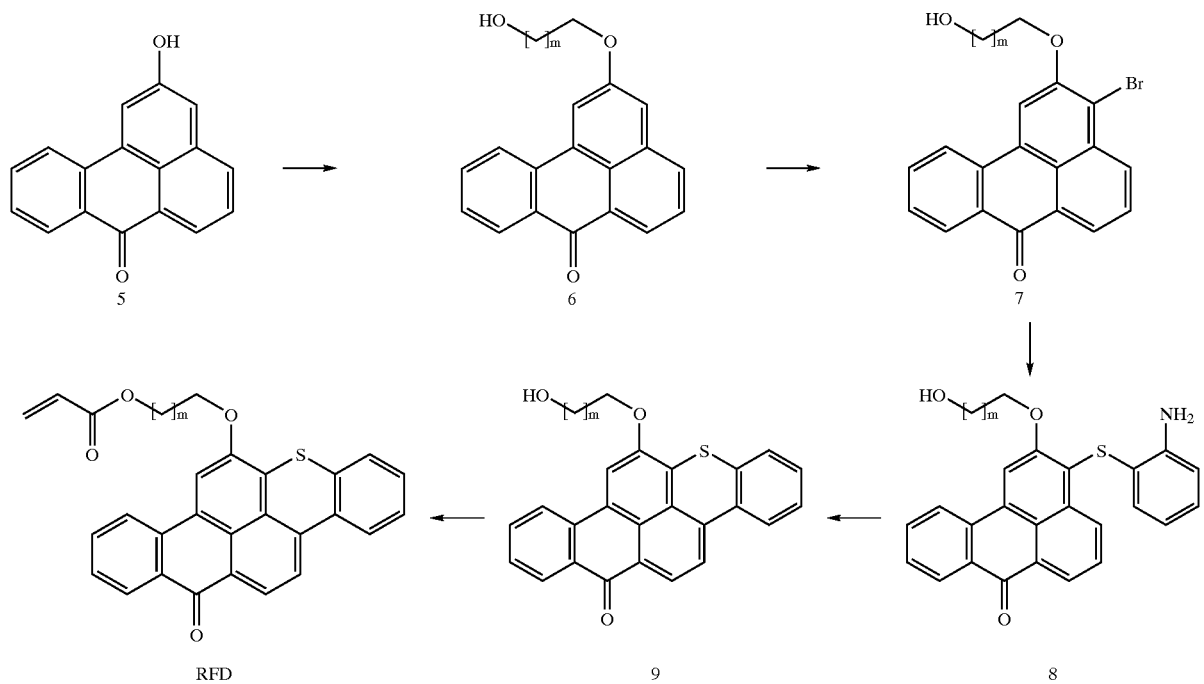

Typically, 2-hyroxybenzanthrone (5) is used as a starting material. This material can be reacted in polar aprotic solvents using hydroxylating reagents such as ethylene carbonate, alkyl diols, or hydroxy alkyl halides to form an alkylenyl hydroxy structure (6). The alkenyl hydroxy (6) can Suitable monomers include any of the free radically polymerizable ethylenically-unsaturated monomers such as, for example, vinyl aromatic monomers, α,β-unsaturated carboxylic acids and their derivatives, vinyl esters of carboxylic acids, N-vinyl compounds, vinyl ketones, and the like. Representative examples of such monomers include styrene, α-methylstyrene, (meth)acrylic acid, (meth) acrylates (as used herein, "(meth)acrylic acid" refers to both acrylic acid and methacrylic acid and "(meth)acrylates" refers to both acrylates and methyacrylates) (for example, methyl methacrylate, butyl methacrylate, 2-ethylhexyl methacrylate, ethyl acrylate, butyl acrylate, iso-octyl acrylate, octadecyl acrylate, cyclohexyl acrylate, phenyl acrylate, benzyl methacrylate), methacrylonitrile, vinyl acetate, vinyl chloride, N-vinylpyrrolidone, N-vinylcaprolactam, and the like.

Preferably, alkyl (meth)acrylate ester monomers are used. Alkyl (meth)acrylate ester monomers useful in the invention include straight chain, cyclic, and branched chain isomers of alkyl esters containing alkyl groups having 1 to about 14 carbon atoms. Representative examples of alkyl (meth) acrylate esters include methyl methacrylate, ethyl ethyl acrylate, n-propyl acrylate, 2-butyl acrylate, iso-amyl acrylate, n-hexyl acrylate, n-heptyl acrylate, isobornyl acrylate, n-octyl acrylate, iso-octyl acrylate, 2-ethylhexyl acrylate, iso-nonyl acrylate, decyl acrylate, undecyl acrylate, dodecyl acrylate, tridecyl acrylate, and tetradecyl acrylate.

Surprisingly, the yellow-green and red fluorescent dyes of the invention can be co-polymerized with one or more fluoromonomers to give fluorescent fluoropolymers. Examples of suitable fluoromonomers can be represented by the following general formula:

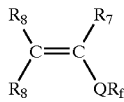

wherein $R_7$ is hydrogen, halogen, or straight chain or branched chain alkyl containing 1 to about 4 carbon atoms; each $R_8$ is independently hydrogen or straight chain or branched chain alkyl containing 1 to about 4 carbon atoms; Q is a covalent bond or an organic linking group; and $R_f$ is a fully or partially fluorinated fluoroaliphatic group.

Preparation of such compounds are known in the art and are described, for example, in U.S. Pat. No. 2,803,615 (Ahlbrecht et al.) and U.S. Pat. No. 2,841,573 (Ahlbrecht et al.), which are incorporated herein by reference in their entirety.

Typically, the fluoromonomers useful in the invention contain from about 5 percent to about 80 percent (preferably from about 20 percent to about 65 percent; more preferably from about 25 percent to about 55 percent) fluorine by weight based upon the total weight of the compound, the loci of the fluorine being essentially in the $R_f$ groups. $R_f$ is a stable, inert, non-polar, preferably saturated, monovalent moiety which is both oleophobic and hydrophobic. $R_f$ preferably contains at least about 3 carbon atoms, more preferably about 3 to about 12 carbon atoms, and most preferably about 3 or 4 carbon atoms. $R_f$ can be a straight chain, branched chain, or cyclic fluorinated alkylene groups, or combinations thereof. $R_f$ is preferably free of polymerizable olefinic unsaturation and can optionally contain catenary heteroatoms.

It is preferred that $R_f$ contain about 35% to about 78% fluorine by weight, more preferably about 40% to about 78% fluorine by weight. The terminal portion of the $R_f$ group contains a fully fluorinated terminal group such as, for example, $-CF_3$, $CF_3CF_2CF_2-$, and $(CF_3)_2CF-$, or can be partially fluorinated such as, for example, $HCF_2-$.

Q is a linking group that can be a covalent bond, divalent alkylene, or a group that can result from the condensation reaction of a nucleophile such as an alcohol, an amine, or a thiol with and electrophile, such as an ester, acid halide, isocyanate, sulfonyl halide, sulfonyl ester, or can result from a displacement reaction between a nucleophile and leaving group. Q can optionally contain one or more catenary heteroatom-containing groups. As used herein, the term "catenary heteroatom-containing group" means a group containing a heteroatom (for example, nitrogen, oxygen, or sulfur) that replaces one or more carbon atoms of the Q linking group in a manner such that the heteroatom-containing group is bonded to at least two carbon atoms of the Q linking group.

Examples of suitable Q linking groups include straight chain, branched chain, or cyclic aklyenes, arylenes, and aralkylenes that optionally contain, for example, an oxy, oxo, hydroxy, thio, sulfonyl, sulfoxy, amino, imino, sulfonamido, carboxamido, carbonyloxy, urethaneylene, urylene, or combination thereof (for example, sulfonamidoalkylene or polyoxyalkylene).

Representative examples of suitable Q linking groups include the following:

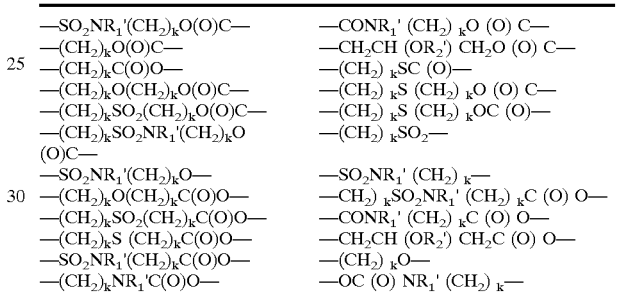

wherein each k is independently an integer of 0 to about 20, $R_1'$ is hydrogen, phenyl, or alkyl containing 1 to about 4 carbon atoms, and $R_2'$ is alkyl-containing 1 to about 20 carbon atoms. Each structure is non-directional, that is, $-(CH_2)_kC(O)O-$ is equivalent to $-O(O)C(CH_2)_k-$.

Useful fluoromonomers include general classes such as (meth)acrylates, vinyl ethers, and allyl compounds containing fluorinated sulfonamido groups, (meth)acrylates derived from fluorochemical telomer alcohols, fluorochemical thiols, and the like. Representative examples of useful fluoromonomers include, for example, 1,1-dihydroperfluorobutyl (meth)acrylate, 1,1-dihydropentafluoropropyl (meth)acrylate, hexafluoroisopropyl (meth)acrylate, 2,2,3,3,4,4,4-heptafluorobutyl (meth) acrylate, 2,2,3,4,4,4-hexafluorobutyl (meth)acrylate, 2,2,3, 3-tetrafluoropropyl (meth)acrylate, 1,1-dihydroperfluorocyclohexylmethyl (meth)acrylate, 1-pentafluoroethyl-2-(trifluoromethyl)propyl (meth) acrylate, 3,3,4,4,5,5,6,6,7,7,8,8,9,9,10,10,10-heptadecafluorodecyl (meth)acrylate, 3,3,4,4,5,5,6,6,7,7,8, 8,8-tridecafluorooctyl (meth)acrylate, N-methyl perfluorooctanesulfonamidoethyl (meth)acrylate, N-ethyl perfluorohexylsulfonamidoethyl (meth)acrylate, N-methyl perfluorooctanesulfonamidoethyl (meth)acrylate, N-ethyl perfluorooctanesulfonamidoethyl (meth)acrylate, N-ethyl perfluorohexylsulfonamidoethyl (meth)acrylate, N-methyl perfluorobutanesulfonamidoethyl (meth)acrylate, the reaction product of isocyanatoethyl methacrylate and N-methylperfluorooctanesulfonamidoethyl alcohol, N-methyl perfluorooctanesulfonamidoethyl vinyl ether, and tetrameric hexafluoropropyleneoxide dihydroacrylate.

Preferably, the dyed fluoropolymers of the invention comprise at least one (meth)acrylate fluoromonomer. More preferably, the dyed fluoropolymers comprise N-methyl perfluorobutanesulfonamidoethyl acrylate and/or N-methyl perfluorobutanesulfonamidoethyl methacrylate.

Dye loading in the dyed polymers of the invention generally varies depending upon the final application of the coating. Typically, however, the dyed fluoropolymers of the invention contain between about 0.001 and 3.0 weight percent of (meth)acrylate functional dye based upon the total polymeric content of the composition (preferably between about 0.01 and 2.0 weight percent).

The dyed polymers of the invention can be prepared by free radical solution polymerization of the starting monomers with a fluorescent functional dye of the invention in any conventional solvent, including both fluorinated and non-fluorinated solvents. Typically, the dye is dissolved into the melted monomers before the solvent is added.

Preferably fluorinated solvents are used. More preferably, non-ozone depleting, non-flammable, and fast drying partially fluorinated (rather than perfluorinated) solvents such as, for example, hydrochlorofluorocarbons (HCFCs), hydrofluorocarbons (HFCs) and hydrofluoroethers (HFEs) are used. As used herein, the term "hydrofluorocarbon" means compounds consisting only of the elements carbon, hydrogen and fluorine, the term "hydrochlorofluorocarbon" means compounds consisting only of the elements carbon, hydrogen, fluorine and chlorine, and the term "hydrofluoroether" means compounds that contain carbon, hydrogen, fluorine, and at least one ether oxygen, and are free of chlorine, bromine and iodine. Most preferably, one or more hydrofluoroethers or mixtures of one or more hydrofluoroethers with one or more other hydrofluorocarbons such as, for example, $CF_3CH_2CF_2CH_3$ are used.

Representative examples of hydrofluoroethers suitable for use in the invention include $n\text{-}C_4F_9OCH_3$, $n\text{-}C_4F_9OCH_2CH_3$, $CF_3CF(CF_3)CF_2OCH_3$, $CF_3CF(CF_3)CF_2OC_2H_5$, $C_8F_{17}OCH_3$, $CH_3O\text{—}(CF_2)_4\text{—}OCH_3$, $C_5F_{11}OC_2H_5$, $C_3F_7OCH_3$, $CF_3OC_2F_4OC_2H_5$, $C_3F_7OCF(CF_3)CF_2OCH_3$, $(CF_3)_2CFOCH_3$, $C_4F_9OC_2F_4OC_2F_4OC_2H_5$, and $C_4F_9O(CF_2)_3OCH_3$.

Typically, an initiator is used to initiate polymerization. A wide range of molecules (for example, monoperoxycarbonates and peroxydicarbonates, perisononanoate, tert-amyl and tert-butylperesters, tert-amyl and tert-butyl perketal, bisperoxides, diazo compounds, and others) can be used as free radical sources for the initiation of polymerization.

The dyed polymers of the invention can be used in coating compositions. An advantage of the invention is that the fluorescent dyes can be used in detecting the uniformity and thickness of the coating. A further advantage is that the fluorescent dyes provide stable, non-leaching color that can be used for decorative purposes.

Coating compositions comprising the dyed fluoropolymers of the invention can further comprise a solvent. Any solvent in which the dyed polymer dissolves to a suitable degree, which does not deleteriously affect the substrate, and which does not leave a harmful residue can be used. It is preferable, however, to use the same solvent that was used in the polymerization reaction. Therefore, preferences for coating solvents are the same as the preferences stated for polymerization solvents.

Typically, the coating composition comprises up to about 50 weight percent dyed fluoropolymer (preferably up to about 35 weight percent; most preferably up to about 28 weight percent). The resulting coatings are generally less than about 3 mils (0.08 mm) thick, but the desired thickness depends upon the specific application. Thicker or thinner coatings can be prepared if desired. The coating composition can be applied to a substrate or article using any suitable means known in the art such as, for example, brushing, dipping, spraying, and flow coating.

Circuit board components and assemblies can be coated with the present dyed coating compositions to form films (sometimes referred to as conformal coatings), which insulate them from contaminants and preserve their electronic functions. Circuit board assemblies can be coated before or after the components have been mounted, but they are typically conformally coated after they have been completely assembled and soldered. Proper coverage and uniformity of the conformal coating over the assembly is critical for effective protection of the assembly. Following application of the coating composition to the assembly, the composition is dried and/or cured to yield the resultant film.

The addition of the fluorescent dyes of the invention into conformal coating compositions aids in the quality assurance inspection of the circuit board assembly for proper coverage of the coating. The fluorescent dyed polymers of the invention can be readily observed by the human eye using, for example, "black light" or on-line with an electro-optical device. The coating thickness (or coating weight) can be measured on-line using techniques in which the dye is excited by optical radiation and the thickness of the coating is determined by the magnitude of the emitted fluorescent radiation.

The dyed coating compositions of the invention can also be used in many other applications where it is desirable for the coating to have color for either decoration or detection. An advantage of the present dyed coating compositions is their high wetfastness properties, which are attributed to the covalent bonding of the dye to the polymer matrix. This is an advantage over coating compositions containing dyes fixed through adsorption or blending and makes the dyed coating compositions of the invention highly suitable for applications where toxicity is an issue such as, for example, in medical and food packaging applications.

EXAMPLES

The invention will be further explained by the following illustrative examples which are intended to be non-limiting.

Glossary Table

| Descriptor | Description, Formula and/or Structure | Availability |
| --- | --- | --- |
| Acryloyl chloride | $CH_2\!\!=\!\!CHCOCl$ | Sigma-Aldrich, Milwaukee, WI |

-continued

Glossary Table

| Descriptor | Description, Formula and/or Structure | Availability |
|---|---|---|
| AD-1 | where n = 4 | See preparation below |
| AD-4 | where n = 1 | See preparation below |
| AD-5 | where n = 7 | See preparation below |
| AD-6 | where n = 1 | See preparation below |
| AD-7 | where n = 5 | See preparation below |

-continued

Glossary Table

| Descriptor | Description, Formula and/or Structure | Availability |
|---|---|---|
| 5-amino-1-pentanol | $NH_2(CH_2)_5OH$ | Sigma-Aldrich |
| 2-amino-1-ethanol | $NH_2(CH_2)_2OH$ | Sigma-Aldrich |
| 2-aminothiophenol | 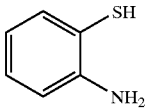 | Sigma-Aldrich |
| BMA | Butyl methacrylate | Sigmal-Aldrich |
| 4-chloronaphthalic anhydride | 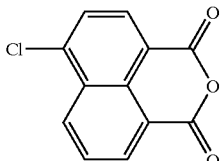 | Acros Organics, Pittsburgh, PA |
| 8-chloro-1-octanol | $Cl(CH_2)_8OH$ | Sigma-Aldrich |
| DMF | dimethylformamide; $(CH_3)_2NC(O)H$ | Sigma-Aldrich |
| ethylene carbonate | 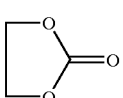 | Sigma-Aldrich |
| HFE-7100 | 3M ™ NOVEC ™ HFE-7100; $C_4F_9OCH_3$ perfluorobutyl methyl ether | 3M Company, St. Paul, MN |
| HFE-7200 | 3M ™ NOVEC ™ FLUID HFE-7200; $C_4F_9OC_2H_5$ perfluorobutyl ethyl ether | 3M Company |
| HFE-72DE | 3M ™ NOVEC ™ HFE-72DE (HFE-7100 (10%), HFE-7200 (20%), and trans-dichloroethylene (70%)) | 3M Company |
| 2-hydroxy benzanthrone | 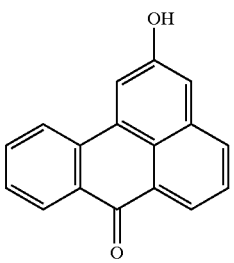 | Can be prepared according to U.S. Pat. No. 4,036,859 (Example 1 and 2) |
| LMA | Lauryl methacrylate | Sigma-Aldrich |
| LUPEROX | Luperox ™ 26M50, t-butyl peroctoate (50%) | Atofina Chem., Philadelphia, PA |
| MAA | Methacrylic acid | Sigma-Aldrich |
| NBS | N-bromosuccinimide | Sigma-Aldrich |
| sodium nitrite | $NaNO_2$ | Sigma-Aldrich |
| tetraethyl ammonium iodide | $(C_2H_5)_4NI$ | Sigma-Aldrich |
| triethyl amine | $N(C_2H_5)_3$ | Sigma-Aldrich |

Preparation 1: Synthesis of MeFBSEA
Ethoxylation of MeFBSA with Ethylene Carbonate
Reaction:

$$C_4F_9SO_2NHCH_3+(CH_2O)_2C=O+Na_2CO_3 \text{ (catalyst)}$$
$$\rightarrow C_4F_9SO_2N(CH_3)CH_2CH_2OH+CO_2$$

Charges:
A. 100 g MeFBSA ($C_4F_9SO_2NHCH_3$, MW=313, 0.32 moles)
B. 2.8 g $Na_2CO_3$ (0.026 moles)
D1. 8 g ethylene carbonate (MW=88) (available from Sigma-Aldrich, Milwaukee, Wis.) melted in oven at 50° C.
D2. 8 g ethylene carbonate
D3. 8 g ethylene carbonate
D4. 10 g ethylene carbonate (total weight=34 g, 0.38 moles)
E. 300 ml water
F. 300 ml water
G. 300 ml 3 wt % sulfuric acid
H. 300 ml water
I. 300 ml water
J. 300 ml water Procedure:
1. Charges A and B were placed in a one liter 3-necked flask with an overhead stirrer, thermocouple, addition funnel, and reflux condenser.
2. The batch was heated to 60° C. (140° F.) at which point the batch was molten and stirring was begun. The set point was increased to 120° C. (248° F.).
3. When the batch reached 120° C., Charge D1 was removed from the oven and transferred to the addition funnel. Charge D1 was then added slowly over a period of 10 minutes. Outgasing (carbon dioxide) was observed. Thirty minutes elapsed until the rate of outgasing was noticed to have diminished.
4. Charge D2 was then transferred to the addition funnel and added over a period of 5 minutes. After 25 minutes, the rate of outgasing had slowed and Charge D3 was added over a 5 minute period. After 30 minutes, Charge D4 was removed from the oven, added to the addition funnel, and added to the batch over a 5 minute period.
5. The set point was reduced to 110° C. (230° F.) and allowed to stir overnight.
6. In the morning, the batch was cooled to 90° C. (194° F.) and the batch was sampled. Gas chromatographic (GC) analysis showed the material to be 96.1% desired product and to contain no amide. Charge E was added. The batch was stirred for 30 minutes, allowed to phase split and the upper water phase was vacuum decanted off. The operation was repeated for Charge F at 63° C. (145° F.).
7. The batch was then agitated with Charge G for 30 minutes at 63° C. (145° F.), then was phase split, and vacuum decanted. The pH of the water layer was tested and found to be less than 2.
8. The batch was then washed with water charges H, I, and J successively at 63° C. (145° F.).
9. The batch was melted and poured out of the flask into a bottle and allowed to solidify. A small amount of water on top of the resulting solid was poured off, and the remaining solid material in the jar was found to weigh 124 g.
10. The solid material was melted into a two-necked 500 ml flask. The melting point was found to be 57° C. (135° F.).
11. The resulting liquid material (113 g) was distilled at 667–933 Pa (5–7 torr Hg). 104 g (92% of undistilled material) distilled at a head temperature of 130–137° C. (266–279° F.) and a pot temperature of 136–152° C. (277–306° F.). Further increase of the pot temperature to 170° C. (338° F.) resulted in no further material distilling over.

Preparation of MeFBSEA (N-methyl-(perfluorobutanesulfonamido)ethyl acrylate)
Reaction:

$$C_4F_9SO_2N(CH_3)CH_2CH_2OH+CH_2=CHCO_2H+\text{triflic}$$
$$\text{acid } (CF_3SO_3H) \text{ catalyst}\rightarrow C_4F_9SO_2N(CH_3)$$
$$CH_2CH_2OC(=O)CH=CH_2+H_2O+CF_3SO_3H$$

Charges:
A. 112 g MeFBSE alcohol ($C_4F_9SO_2N(CH_3)CH_2CH_2OH$, 0.313 moles)
B. 0.07 g phenothiazine (available from Sigma-Aldrich, Milwaukee, Wis.)
C. 0.11 g methoxyhydroquinone (MEHQ) (available from Sigma-Aldrich, Milwaukee, Wis.)
D. 100 g heptane
E. 27.5 g acrylic acid (0.38 moles)
F. 1 g anhydrous triflic (trifluoromethanesulfonic) acid (available as FC-24 from 3M, St. Paul, Minn.)
G. 300 g water
H. 300 g water Procedure:
1. Charges A, B, C, D, E and F were added to a 3-necked flask equipped with decanter assembly, overhead stirrer, and a thermocouple under positive nitrogen pressure.
2. The flask was warmed to 60° C. and the stirring was begun. The batch was stirred at reflux which was initially at 96° C. and rose to 102° C. by the end of the reaction. The theoretical water that should be collected in the decanter was 6.3 ml. After 15 minutes of refluxing, 2 ml had collected. After 1 hour and 15 minutes, the reflux temperature was 99° C. and 5 ml had collected. After 5 hours and 15 minutes the reflux temperature was 102° C. and 5.4 ml had collected. A sample was withdrawn from the batch and GC analysis showed no unreacted alcohol, 92.6% desired product and 7.4% high boiler.
3. The batch was stripped atmospherically to the decanter until at 103° C. no more heptane collected in it.
4. The batch was cooled to 64° C. and vacuum was pulled slowly. More heptane was stripped off until at 5 torr no more liquid was observed to be distilling off.
5. Vacuum was broken and Charge G was added. The batch was stirred at 64° C. for 15 minutes, allowed to phase spilt and the upper layer was vacuumed off.
6. This operation was repeated with Charge H and then the batch was allowed to cool to room temperature at which point the product was a solid. The remaining water was poured off and the product material was melted out of the container into a jar. The weight of the product was 125 g (theoretical 129 g). GC analysis showed the material to be 92.64% desired acrylate and 7.36% acrylic acid Michael adduct.

Preparation 2: Synthesis of MeFBSEMA
MeFBSEMA (N-methyl-(perfluorobutanesulfonamido) ethyl methacrylate) was prepared as described in Preparation 1 above, except using methacrylic acid in place of acrylic acid Preparation 3: Synthesis of AD-1

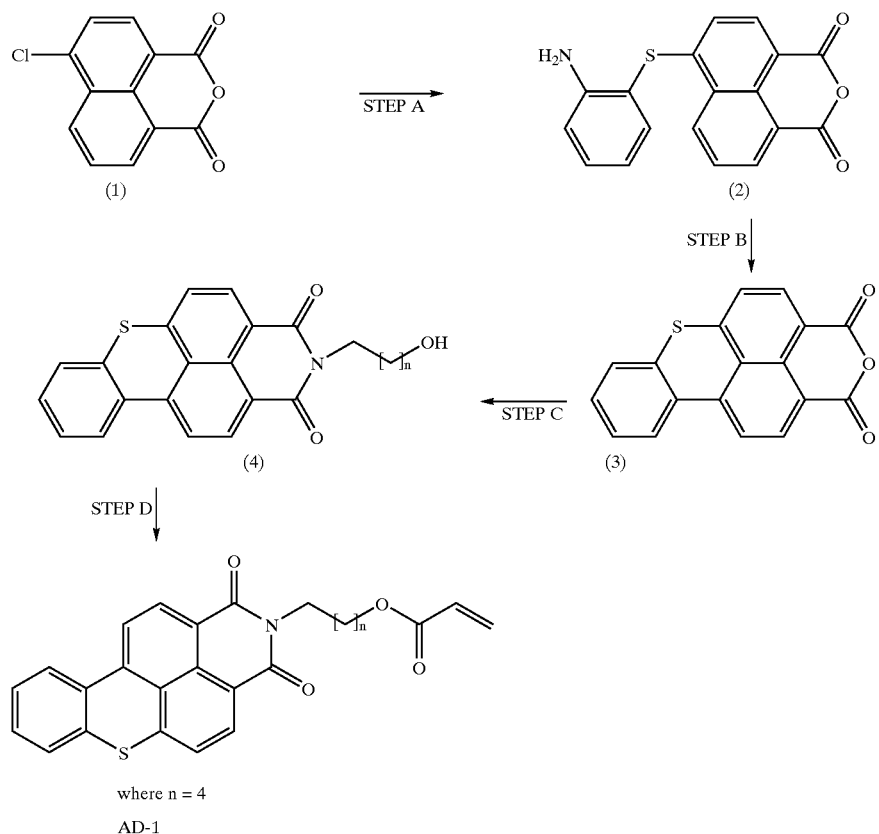

where n = 4

AD-1

Step A: Preparation of (2)

A 1000 mL round bottom flask equipped with a heating mantle, stirrer and dropping funnel was charged with 4-chloronaphthalic anhydride ((1), 125 g, 0.54 moles), potassium carbonate (36.9 g, 0.27 moles), 215 g isopropyl alcohol, and 322 g sulfolane and heated to about 50° C. 2-aminothiophenol (73.9 g moles) was added dropwise so that the temperature was maintained below 80° C. The mixture was then heated to 90° C. and held for 3 hours. The mixture was cooled to 15° C. and the resulting orange precipitate was recovered via filtration with a Buchner funnel. The solid was resuspended in DI water (470 g) and then filtered using a Buchner funnel. The solid was dried and analysis via $^{13}$C NMR confirmed the structure (2).

Step B: Preparation of (3)

A 5000 mL round bottom flask fitted with a dropping funnel and immersed in an ice-water cooling bath was charged with (2) (241.0 g, 0.75 moles) and 3600 g DMF. HCl (600 g, concentrated) was slowly added dropwise, keeping the temperature below 15° C. An aqueous solution of sodium nitrite (52.5 g, 21%) was added and the reaction mixture was stirred for two hours, maintaining the temperature below 5° C. CuSO$_4$.5H$_2$O (3.0 g, 0.012 moles) was added and a mild exotherm occurred. The cooling bath was then replaced with a heating mantle, and nitrogen gas evolved as the temperature was slowly elevated to 100° C. and held for 3 hours. The mixture was cooled to ambient temperature (~25° C.) and filtered using a Buchner funnel. The resulting solid was resuspended in DI water (1000 g) and filtered again using a Buchner funnel. The solid (3) was dried to yield 171 g (75% of the theoretical material).

Step C: Preparation of (4)

A 1000 mL round bottom flask fitted with a condenser was charged with (3) (40.0 g, 0.13 moles), 5-amino-1-pentanol (13.5 G, 0.13 moles) and DMF (240 g) and the ensuing mixture was heated to reflux (~155° C.) for 3 hours. After it was determined that no starting material remained (via thin layer chromatography (TLC) in ethyl acetate) the mixture was cooled to 80° C. and 400 g DI water was added, keeping the temperature between 70–80° C. until all the water was added. The resulting suspension was then filtered using a Buchner funnel and the solid material was resuspended in 500 g DI water and filtered again using a Buchner funnel. The yield of resulting material (4) was 41 g.

Step D: Preparation of AD-1

A one liter three neck round bottom flask fitted with an overhead stirrer and dropping funnel was charged with (4) (25.0 g; 0.062 moles), dimethyl formamide (310.0 g) and triethyl amine (8.15 g; 0.08 moles). The resulting mixture was stirred and heated to 40° C. at which time acryloyl chloride (6.44 g, 0.07 moles) was added drop wise to the mixture over 30 minutes while keeping the temperature at approximately 40° C. After two hours, additional triethyl amine (3.0 g) and acryloyl chloride (2.2 g) were added. The resulting mixture was stirred for another hour and then cooled to 20° C. Deionized (DI) water (500.0 g) was added to the cooled mixture and solid AD-1 was isolated via filtration with a Buchner funnel. AD-1 was re-suspended in DI water (700.0 g), filtered using a Buchner funnel and air dried (yielding 24.7 g; 96% purity of AD-1. The structure and purity were confirmed via $^{13}$C nuclear magnetic resonance (NMR) analysis.

Preparation 4: Synthesis of AD-4

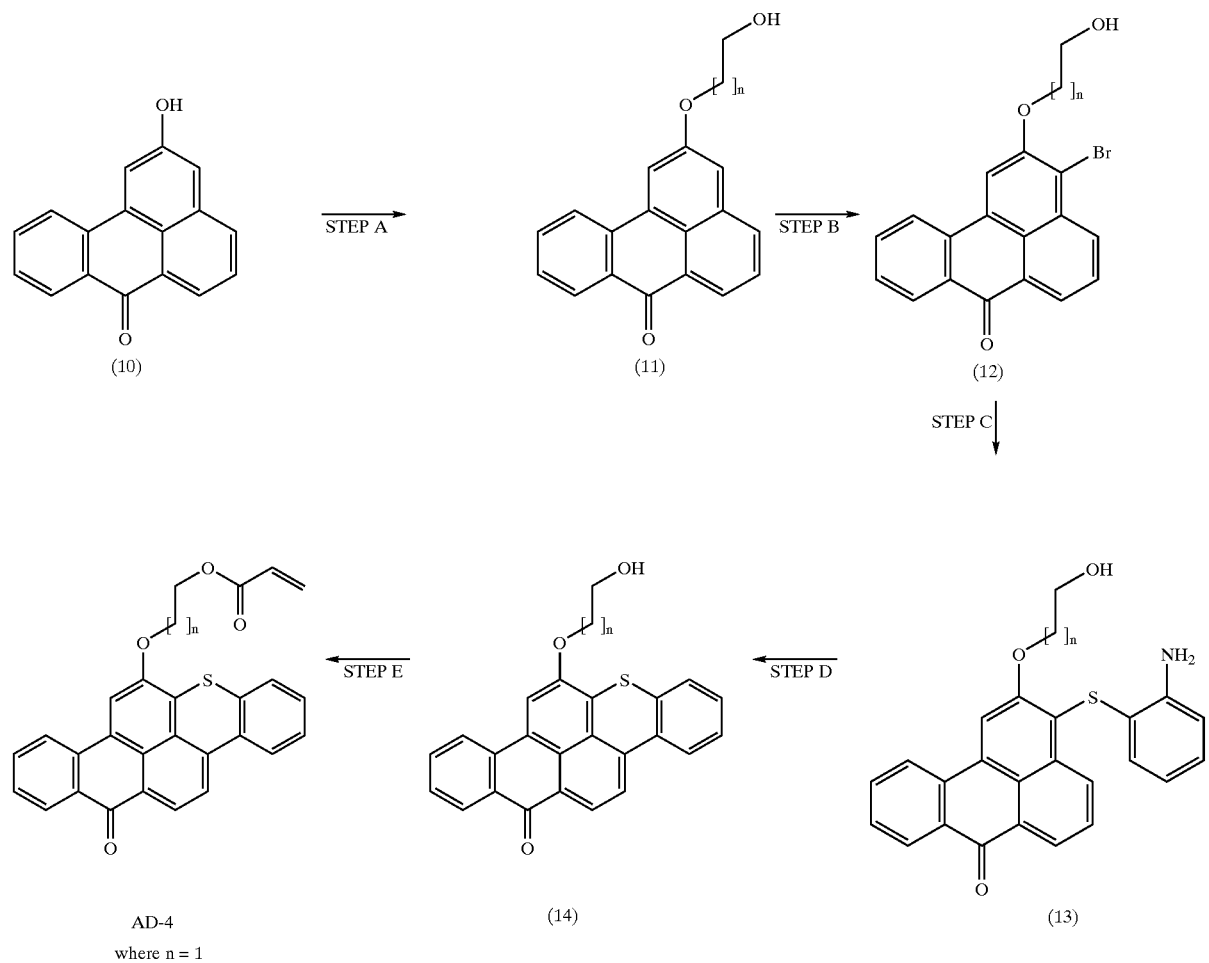

AD-4
where n = 1

Step 1: Preparation of (11)

A 1 L three neck round bottom flask equipped with a mechanical stirrer and thermometer was charged with 2-hydroxy benzanthrone ((10), 75.0 g; 0.3 mole), ethylene carbonate (35.0 g; 0.4 mole), tetraethylammonium iodide (18.0 g; 0.07 mole) and dimethylformamide (300.0 g). The ensuing mixture was heated at reflux for 15 hours, and additional ethylene carbonate (25.0 g; 0.3 mole) and tetraethylammonium iodide (8.0 g; 0.03 mole). The resulting mixture was cooled to ambient temperature and DI water was added (200.0 g). The precipitate was filtered, allowed to air dry and recrystallized in isopropyl alcohol (yielding 70 g. of (11)).

Step 2: Preparation of (12)

A 1 L three neck round bottom flask equipped with a mechanical stirrer and condenser was charged with 11 (70.0 g; 0.24 mole), NBS (53.0 g; 0.3 mole) and dimethylformamide (500.0 g). The ensuing stirred mixture was heated to about 55° C. for 3 hours, cooled to ambient temperature and DI water (500.0 g) was added. The aqueous mixture was extracted with chloroform (250.0 g). This organic extract was then washed three times with DI water (500.0 g aliquots), chloroform was removed using a rotary evaporator, and the resulting yellow material (12) was oven dried (75 g; 88% yield).

Step 3: Preparation of (13)

A 500 mL three neck round bottom flask equipped with a mechanical stirrer and condenser was charged with 12 (73.0 g; 0.2 mole), sodium carbonate (14.4 g; 0.13 mole), 2-aminothiophenol (27.5 g; 0.22 mole) and dimethylformamide (300.0 g). The ensuing mixture was stirred and heated at reflux for 3 hours, cooled to ambient temperature, and filtered. The yellow solid material was washed with DI water (20.0 g), filtered and oven dried to yield (13) (22.0 g; 22% yield).

Step 4: Preparation of (14)

A 1 L three neck round bottom flask equipped with a mechanical stirrer and dropping funnel was charged with (13) (20.6 g; 0.05 mole) and dimethylformamide (300.0 g). The ensuing mixture was cooled to 20° C. using an ice bath, and HCl (55.0 g; concentrated) was slowly added dropwise, keeping the temperature at or below 20° C. With continued cooling, an aqueous solution of sodium nitrite (24.0 g; 16.6%) was added dropwise over a period of one hour, keeping the temperature at or below 5° C. Upon completion of the addition, the cooled mixture was stirred for an additional 2 hours. The cooling bath was removed and replaced with a heating mantle. $Cu(SO_4)_2$ (0.3 g) was added to the mixture and a temperature of 130° C. was maintained for 3 hours. The mixture was then cooled to ambient temperature and filtered. The filtered solid was re-slurried with DI water (200.0 g), filtered and oven dried to yield (14) (14.0 g; 71% yield; mp 301–303° C.). Structure and purity (>90%) were confirmed using $^{13}$C NMR.

Step 5: Preparation of AD-4

A 1 L three neck round bottom flask equipped with a mechanical stirrer and dropping funnel was charged with (14) (25.0 g; 0.063 mole) dimethylformamide (690 g.) and triethyl amine (7.65 g; 0.075 mole). The ensuing stirred mixture was heated to 40° C. and acryloyl chloride (6.3 g; 0.07 mole) was added dropwise over 0.5 hour. The resulting mixture was maintained at 40° C. for 3 hours, cooled to 20° C. in an ice bath, and DI water (500.0 g) was added. The precipitate was filtered from the filtrate using a Buchner funnel and the solid was washed three times with DI water (500.0 g each aliquot) to yield a AD-4 (35.0 g). Structure and purity (>95%) were confirmed using $^{13}$C NMR.

Preparation 5: Synthesis of AD-5

The preparation of AD-5 (where n=7) essentially follows the description of the preparation for AD-4 (where n=1) above with the exception that Step A was replaced by the following:

A 500 mL three neck round bottom equipped with a mechanical stirrer, condenser and addition funnel was charged with 1 (30.0 g; 0.12 mole), DI water (200 g.) NaI (1.8 g; 0.12 mole) and aqueous NaOH in (19.4 g; 50%). The stirred mixture was heated to reflux and 8-chloro-1-octanol (40.1 g, 0.24 mole) was added dropwise over 1.5 hours. The temperature was maintained for 2 additional hours, then cooled to ambient temperature, filtered and the resulting solid (15) was air dried (35.8 g). The stoichiometric equivalent of this material was then used in the succeeding steps outlined above to ultimately yield AD-5 (where n=7).

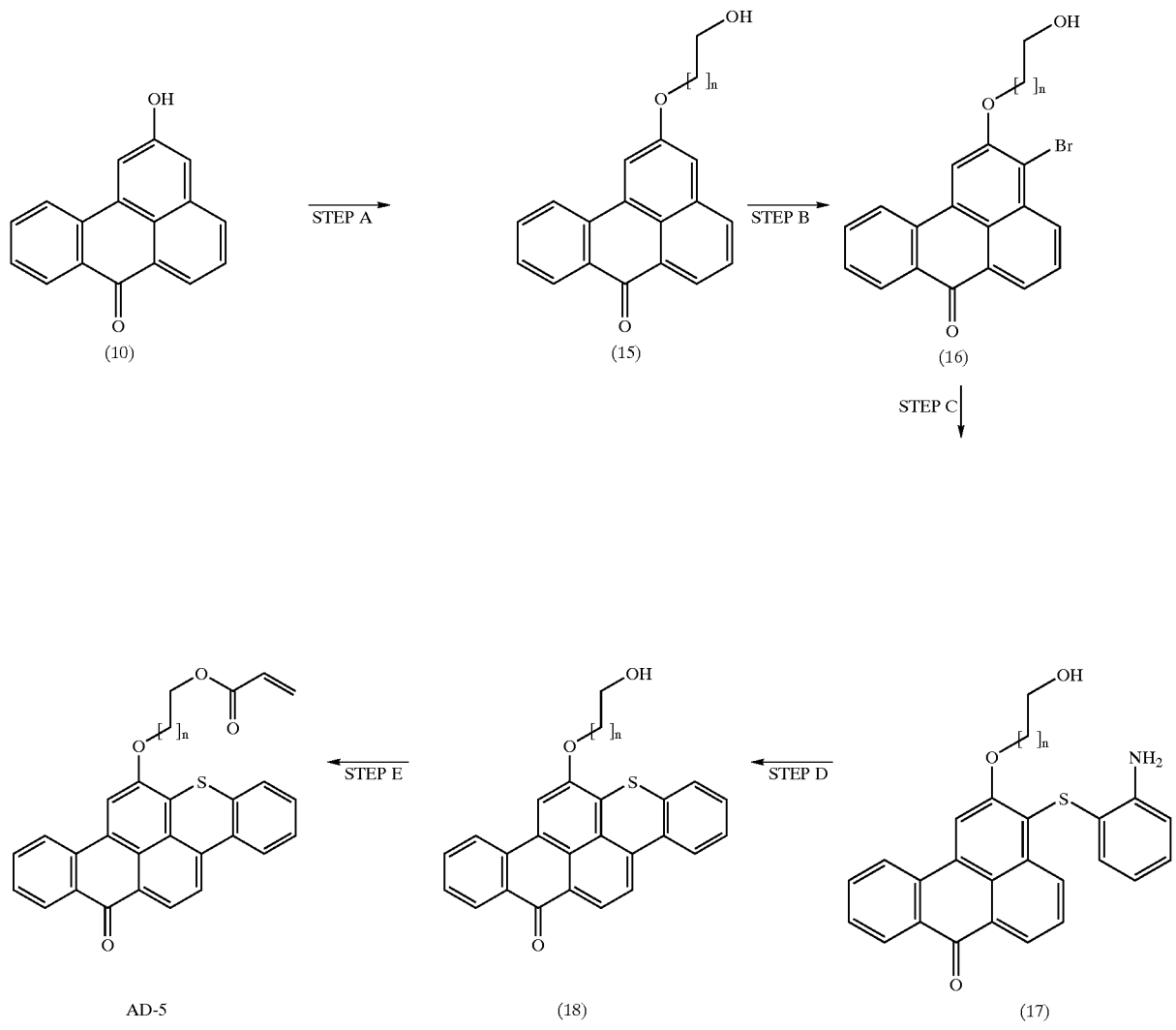

Preparation 6: Synthesis of AD-6
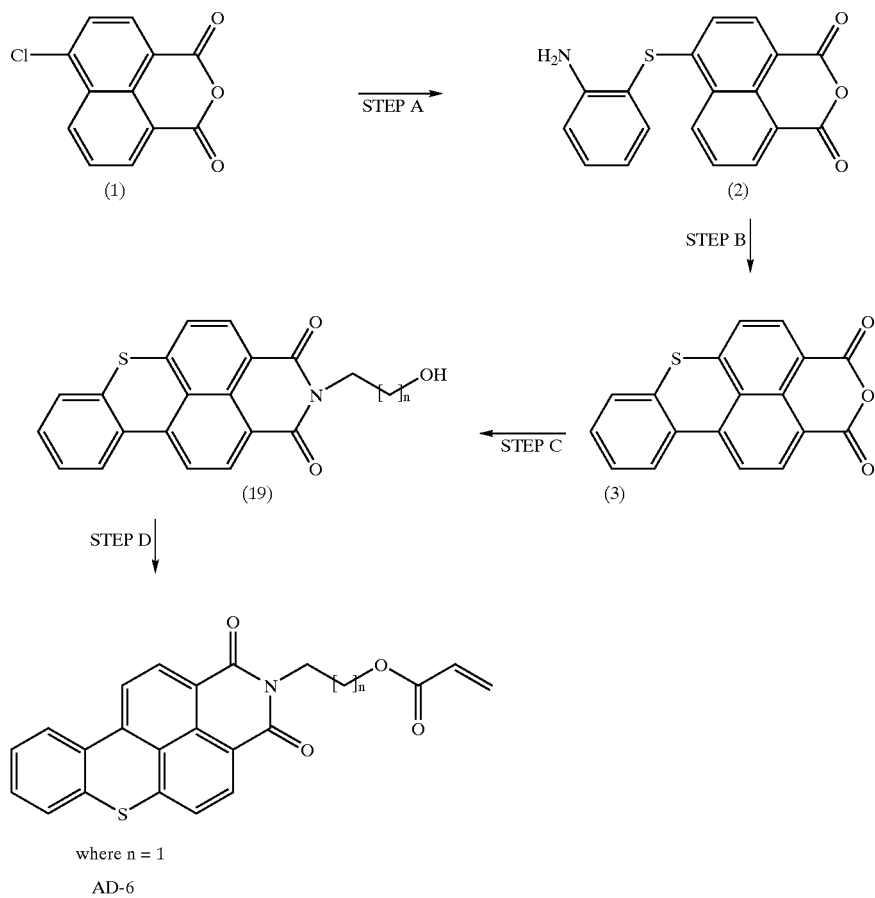
AD-6 was prepared essentially according to the preparation followed for synthesis of AD-1 with the exception that in Step C, 2-amino-1-ethanol (0.13 moles) was used instead of 5-amino-1-pentanol. In the synthesis of the acrylate dye, AD-6, a stoichiometric equivalent of 19 was used.
Preparation 7: Synthesis of AD-7
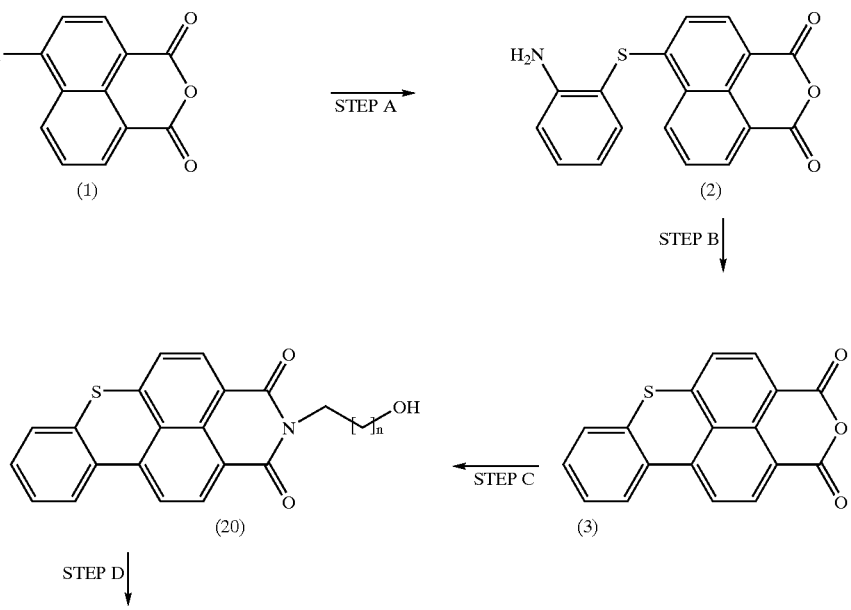

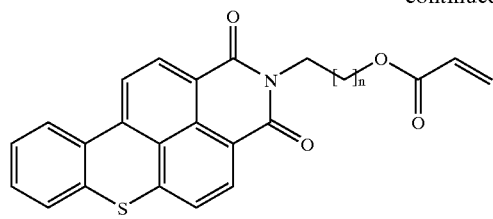

AD-6 where n = 5

AD-7 was prepared essentially according to the preparation followed for synthesis of AD-1 with the exception that in Step C, 6-amino-1-hexanol (0.13 moles) was used instead of 5-amino-1-pentanol. In the synthesis of the acrylate dye, AD-6, a stoichiometric equivalent of 20 was used.

Coating and Test Methods

Dip Coating Method

Each substrate (described below) was wiped with ethanol using a Kimwipe™ sheet (available from Kimberly Clark, Roswell, Ga.) and then ultrasonically treated in a warm bath of HFE-72DE for about 5 minutes, removed, and allowed to air dry at ambient conditions. The substrates were then dipped into solutions of the fluoropolymer to be tested and withdrawn at a constant rate of 5.3 in/min (13.46 cm/min). Each coated substrate was then air dried at ambient temperature (~72° F. (~22° C.)) and visually inspected for a uniform, blemish-free coating.

Coating Thickness Test Method

Coating thickness was measured with a micrometer at six points (top ⅓, middle ⅓ and bottom ⅓) on the front and back of each coated substrate. Average values are reported below in Table 1.

Flexibility Test Method

Tin coated steel panels (3 inch (7.6 cm)×5 inch (12.7 cm), 0.0107 inch (0.027 cm) thick) were coated with solutions of fluoropolymer as described above. The coated panels were bent 180° over a 0.125 inch (0.32 cm) diameter mandrel. The coating on each panel was then visually inspected and evaluated for cracks, crazes, or delaminations using a 6× magnifying loupe. If any cracks, crazes, or delaminations were observed, the coating failed this test. Results are reported below in Table 1.

Dielectric Withstanding Voltage Test Method

IPC-B-25A test boards (available from T.R.C. Circuits, Inc., Minneapolis, Minn.) were coated with solutions of fluoropolymer as described above. The D pattern on each IPC-B-25A test board was subjected to an increasing bias from 0 to 1500 V over 15 seconds and then held for one minute at 1500 V. If the board exhibited flashover, sparkover or breakdown, the coating failed this test. Results are reported below in Table 1.

Visual Test for Coating Uniformity

Coating uniformity was qualitatively determined by placing substrates coated as described above under a black light (Standard fluorescent desk lamp fitted with two 18 inch (45 cm) GE 15 W blacklights) and inspecting for fish eyes or other coating defects.

Thermal Gravimetric Analysis (TGA)

The thermal decomposition of each conformal coating material was determined by thermal gravimetric analysis (TGA) under an inert nitrogen atmosphere using a 10° C. per minute temperature ramp using a Perkin Elmer Thermogravimetric Analyzer TGA 7 (Perkin Elmer Instruments, Norwalk, Conn.). Results are shown in FIG. 1.

Solubility in Acetone

Solubility of the dyes in acetone was determined by weighing a small amount of dye into a jar and adding small aliquots of acetone until no undissolved dye remained. Results are listed below in Table 2.

Solubility in Acrylate Monomer

Solubility of the dyes was determined in various acrylate monomers using standard fluorescence measurement techniques (SPEX Fluorolog-3 Spectrophotometer, SPEX Industries, Edison, N.J.). Results are listed below in Table 3.

EXAMPLE 1

A 600 mL Parr reactor (available from Parr Instrument Co., Moline, Ill.) was charged with MeFBSEA (146.30 g; 0.36 moles), MeFBSEMA (10.03 g; 0.023 moles), BMA (3.34 g; 0.023 moles), LMA (5.85 g; 0.023 moles), MAA (1.67 g; 0.020 moles) and AD-1 (0.011 g). Upon dissolution of the charges, LUPEROX (9.24 g) and HFE-7100 (440.80 g) were added. The reactor was then sealed and degassed four times, by pulling a vacuum of 5–10 psig (34–68 kPa) and then purging with nitrogen. The reactor temperature was then elevated and held at 80° C. for about 24 hours. The resulting reaction mixture was filtered. The resulting filtered solution was used to coat substrates for testing.

COMPARATIVE EXAMPLE C1

Comparative Example C1 was prepared according to the procedure described for Example 1, with the exception that the addition of AD-1 was omitted.

TABLE 1

| Ex. | Dye | Coating Thickness (mm) | Flexibility Test | Dielectric Withstand Test | Visual Test |
|---|---|---|---|---|---|
| 1 | AD-1 | 0.0464 | Passed | Passed | Passed |
| C1 | No dye | 0.0468 | Passed | Passed | Passed |

TABLE 2

Solubility of dye in acetone

| Dye | Solubility (g acetone/mg of dye) |
|---|---|
| AD-1 | 0.83 |
| AD-4 | 11.0 |
| AD-5 | 0.65 |
| AD-6 | 11.6 |
| AD-7 | 0.83 |

TABLE 3

| | Solubility of dyes in acrylate monomers | |
|---|---|---|
| Dye | Acrylate Monomer | Solubility (µg dye/ mL of acrylate monomer) |
| AD-6 | LMA | 227 |
| AD-7 | LMA | 114 |
| AD-1 | LMA | 816 |
| AD-6 | BMA | 559 |
| AD-7 | BMA | 301 |
| AD-1 | BMA | 1217 |

What is claimed:

1. A compound represented by the following formula:

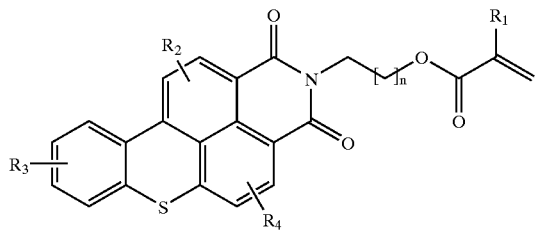

wherein n is 4; $R_1$ is hydrogen or methyl; and $R_2$, $R_3$, and $R_4$ are each independently selected from the group consisting of hydrogen, alkyl, aryl, alkoxy, aralkyl, alkaryl, halo, and trifluoromethyl.

* * * * *

UNITED STATES PATENT AND TRADEMARK OFFICE
CERTIFICATE OF CORRECTION

PATENT NO.         : 6,930,184 B2
APPLICATION NO. : 10/206315
DATED                 : August 16, 2005
INVENTOR(S)       : David B. Olson It is certified that error appears in the above-identified patent and that said Letters Patent is hereby corrected as shown below:

In Column 4
in Structure 4,

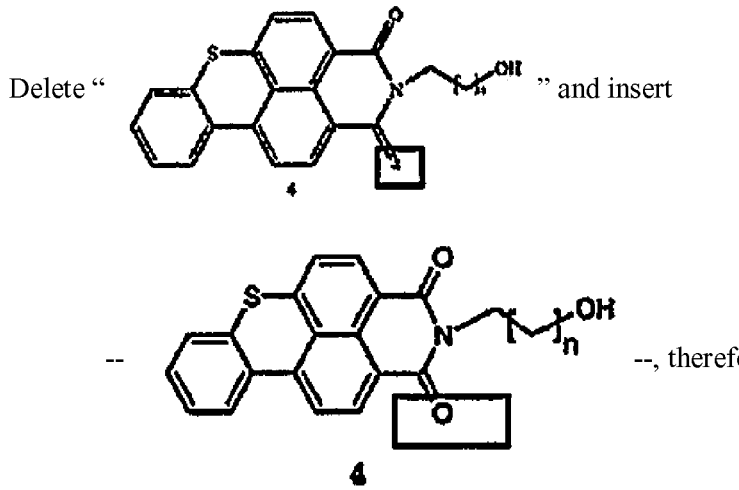

In Columns 13 – 14
Row 3, below "2-amino-1-ethanol" insert -- 6-amino-1-hexanol    $NH_2 (CH_2)_6 OH$    Sigma - Aldrich --.

In Column 17
Line 59, delete "$CuSO_4 \cdot 5H_2$" and insert -- $CuSO_4 \cdot 5H_2$ --, therefor.

Signed and Sealed this

Tenth Day of April, 2007

JON W. DUDAS
*Director of the United States Patent and Trademark Office*